United States Patent
Myoung et al.

(10) Patent No.: US 11,152,240 B2
(45) Date of Patent: Oct. 19, 2021

(54) APPARATUS FOR CONVEYING CARRIER AND SYSTEM FOR CONTROLLING CARRIER HAVING THE SAME

(71) Applicant: SEMES CO., LTD., Chungcheongnam-do (KR)

(72) Inventors: Noh Hoon Myoung, Seoul (KR); Han Seon Kang, Gyeonggi-do (KR); Jung Min Yoon, Daegu (KR); Chung Il Cho, Seoul (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 16/985,537

(22) Filed: Aug. 5, 2020

(65) Prior Publication Data
US 2021/0043486 A1 Feb. 11, 2021

(30) Foreign Application Priority Data
Aug. 7, 2019 (KR) .......................... 10-2019-0095994

(51) Int. Cl.
| H01L 21/677 | (2006.01) |
| B66C 13/40 | (2006.01) |
| F16F 15/03 | (2006.01) |
| H01L 21/67 | (2006.01) |
| B66C 19/00 | (2006.01) |

(52) U.S. Cl.
CPC ........ *H01L 21/67733* (2013.01); *B66C 13/40* (2013.01); *B66C 19/00* (2013.01); *F16F 15/035* (2013.01); *H01L 21/6773* (2013.01); *H01L 21/67259* (2013.01); *H01L 21/67709* (2013.01)

(58) Field of Classification Search
None
See application file for complete search history.

(56) References Cited

U.S. PATENT DOCUMENTS

| 5,601,027 A * | 2/1997 | Shinozaki ................ B61K 7/10 |
| | | 104/249 |
| 2001/0008983 A1 * | 7/2001 | Yotsumoto ........ H01L 21/67733 |
| | | 700/230 |

FOREIGN PATENT DOCUMENTS

| KR | 20050011207 A | 1/2005 |
| KR | 20180061542 A | 6/2018 |
| KR | 20180136187 A | * 12/2018 |
| KR | 20180136187 A | 12/2018 |
| KR | 20190020461 A | 3/2019 |
| KR | 20190058443 A | 5/2019 |
| KR | 1020190063951 A | 6/2019 |

OTHER PUBLICATIONS

Korean Notice of Allowance issued in Korean Patent Application No. 10-2019-0095994, dated Jan. 11, 2021, 2 pages.
Korean Office Action issued in Korean Application No. 10-2019-0095994, dated Oct. 16, 2020, 6 pages.

* cited by examiner

*Primary Examiner* — Gerald McClain
(74) *Attorney, Agent, or Firm* — RatnerPrestia

(57) ABSTRACT

Provided is an apparatus for conveying a carrier and a system for controlling a carrier having the same, which couples a hoist and a hand using a non-contact damping structure using an eddy current. The apparatus for conveying the carrier conveys a carrier containing a wafer, and includes: a gripper for gripping the carrier; and a lifter for raising and lowering the gripper, in which the gripper and the lifter are connected in a non-contact damping structure, and a relative motion thereof is suppressed.

16 Claims, 6 Drawing Sheets

[FIG. 1]
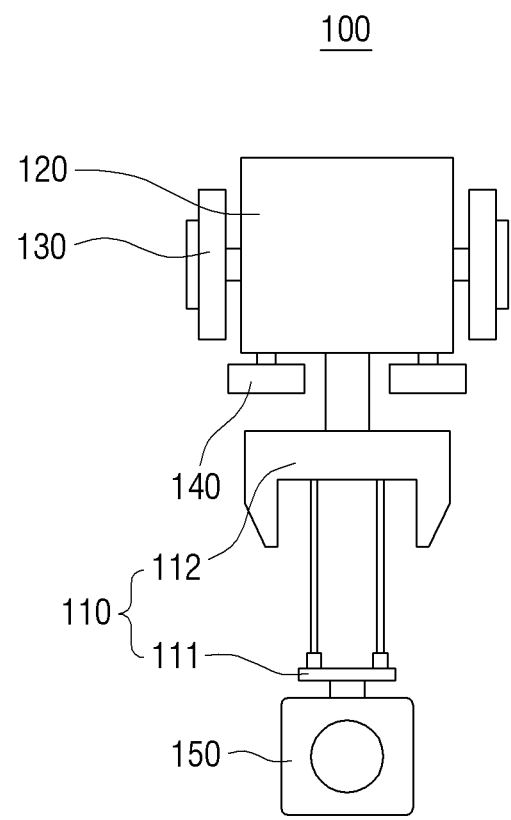

[FIG. 2]
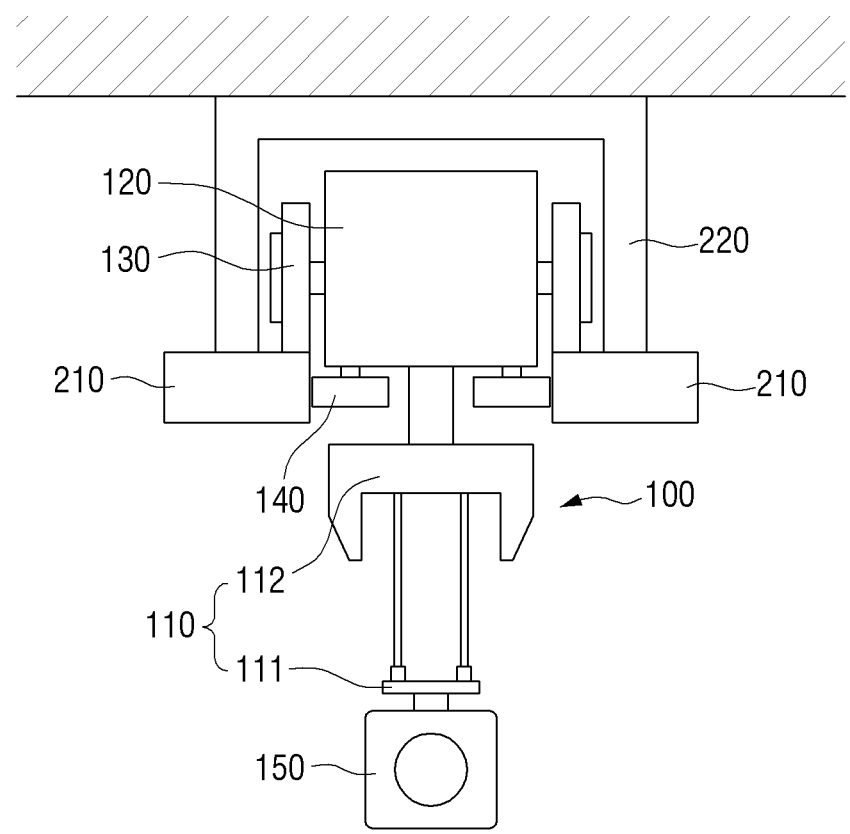

[FIG. 3]
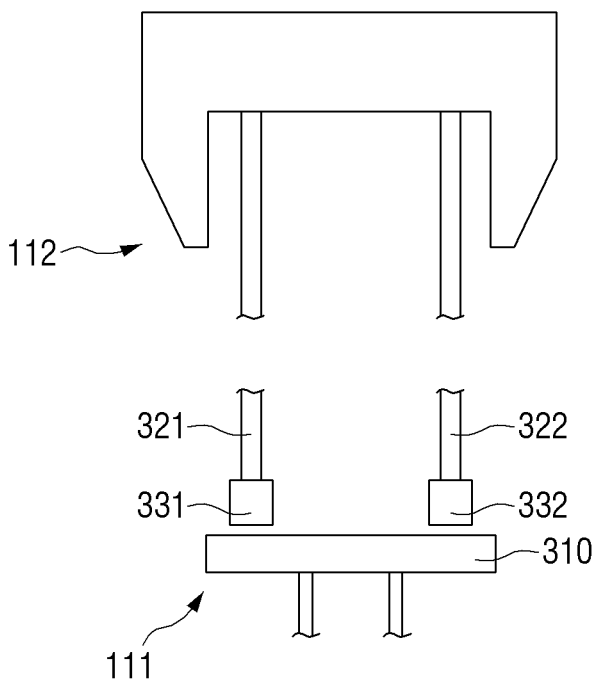

[FIG. 4]
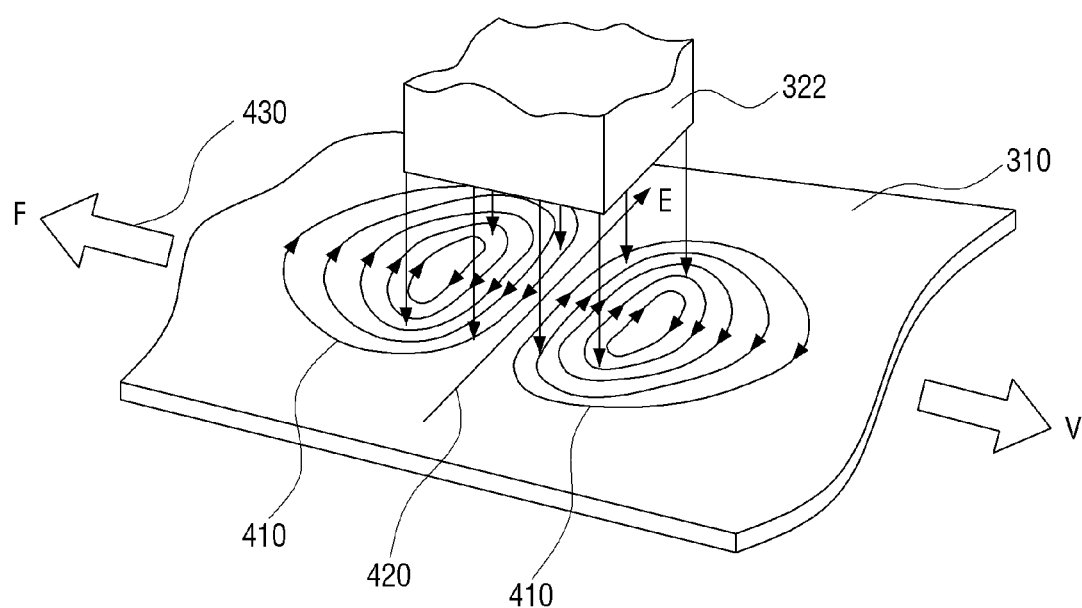

[FIG. 5]
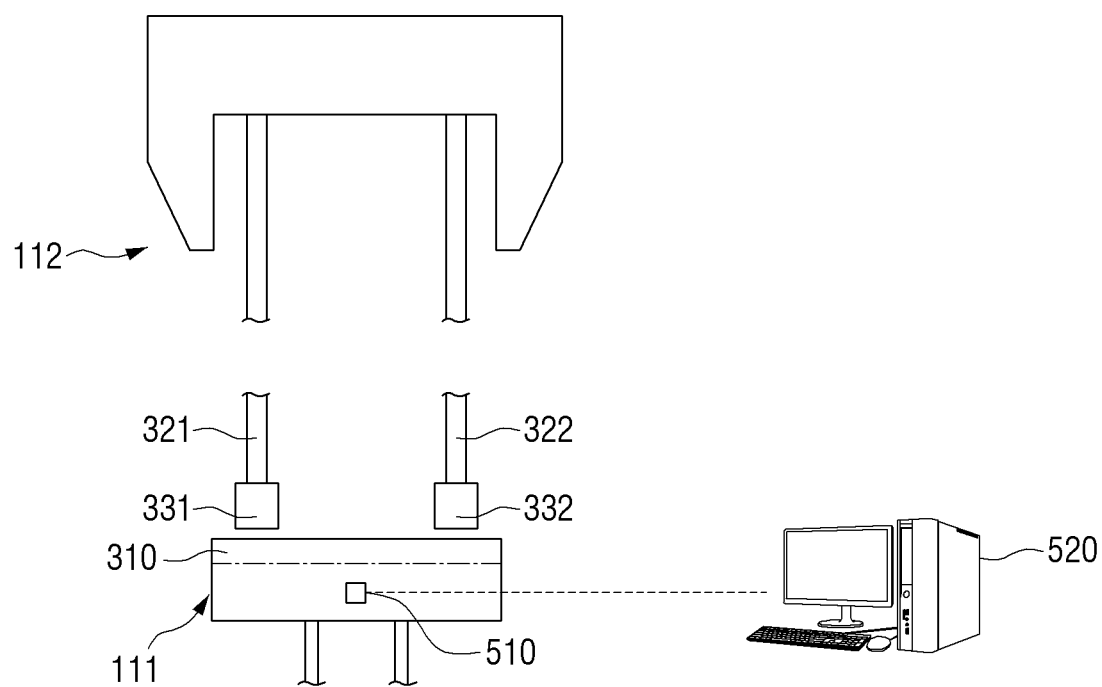

[FIG. 6]
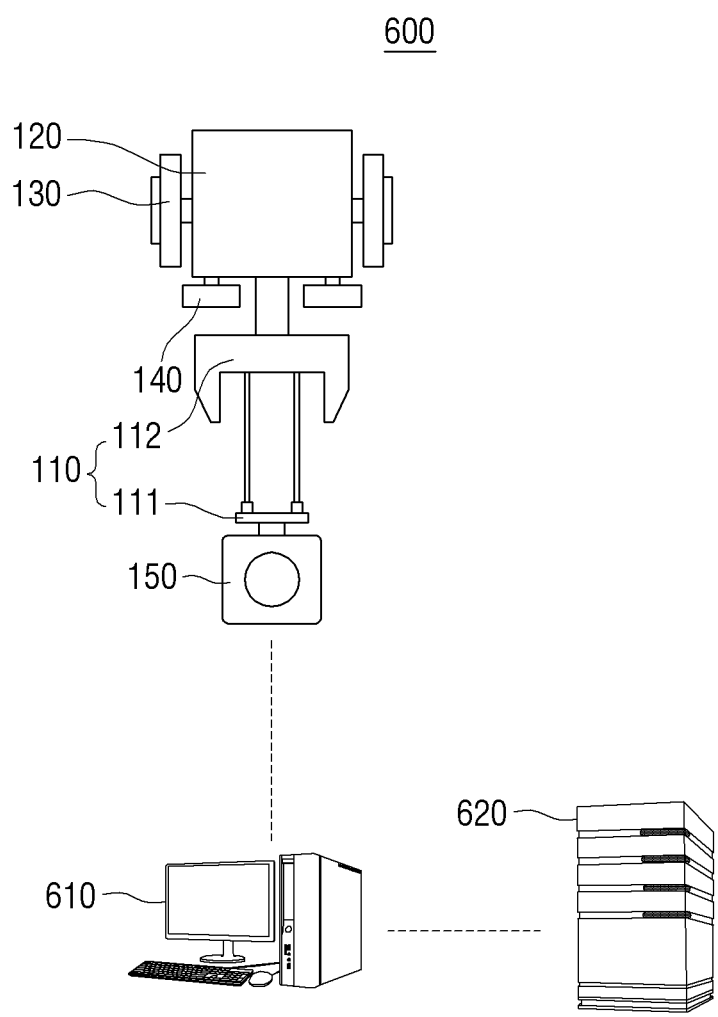

APPARATUS FOR CONVEYING CARRIER AND SYSTEM FOR CONTROLLING CARRIER HAVING THE SAME

CROSS-REFERENCE TO RELATED APPLICATION

This application claims priority from Korean Patent Application No. 10-2019-0095994 filed on Aug. 7, 2019 in the Korean Intellectual Property Office, and all the benefits accruing therefrom under 35 U.S.C. 119, the contents of which in their entirety are herein incorporated by reference.

BACKGROUND

1. Technical Field

The present invention relates to an apparatus for conveying a carrier and a system for controlling a carrier having the same. More specifically, it relates to an apparatus for conveying a carrier and a system for controlling a carrier having the same, used in semiconductor manufacturing facilities.

2. Description of the Related Art

A wafer may be manufactured through various processes in a clean room equipped with a semiconductor device manufacturing line. Here, the wafers is stored in a front opening unified pod (FOUP), and may be conveyed to facilities where each process is performed through overhead hoist transport (OHT) arranged on a ceiling of the clean room.

SUMMARY

The OHT may use hoists and hands to safely transport the FOUP to a destination in a clean room with a variety of facilities used to manufacture semiconductor devices.

The hoist and hand may use a pin/holder structure to allow the OHT to seat the FOUP in a correct position when loading and unloading, and to prevent the FOUP from being deviated from during OHT traveling. In this case, a free space is provided between the pin and the holder to prevent damage due to forced restraint.

However, when the hoist and hand use such a pin/holder structure, since it is not a fitting method, vibration and impact may occur due to impact between the pin and the holder during transfer of the FOUP, and may be transferred to the wafer in the FOUP.

Aspects of the present invention provide an apparatus for conveying a carrier that couples a hoist and a hand using a non-contact damping structure using an eddy current.

Aspects of the present invention also provide a system for controlling a carrier having an apparatus for conveying a carrier that couples a hoist and a hand using a non-contact damping structure using an eddy current.

However, aspects of the present invention are not restricted to those set forth herein. The above and other aspects of the present invention will become more apparent to one of ordinary skill in the art to which the present invention pertains by referencing the detailed description of the present invention given below.

In an aspect of an apparatus for conveying a carrier of the present invention, the apparatus for conveying the carrier conveys a carrier containing a wafer, and includes: a gripper for gripping the carrier; and a lifter for raising and lowering the gripper, in which the gripper and the lifter are connected in a non-contact damping structure, and a relative motion thereof is suppressed.

The gripper and the lifter may be connected in the non-contact damping structure using a magnet member and a plate.

The relative motion of the gripper and the lifter may be suppressed using a current formed between the magnet member and the plate.

The current may be an eddy current.

The lifter may be connected to the gripper using a plurality of connecting members, the magnet member may be installed at an end of the connecting member, and the plate may be installed on the gripper adjacent to the magnet member.

The magnet member may be formed of a non-ferrous metal.

The magnet member may be an electromagnet.

The relative movement of the gripper and the lifter may be suppressed when the apparatus for conveying the carrier is traveling.

Damping between the gripper and the lifter may be controlled depending on a strength of the magnet member.

The apparatus for conveying the carrier may further include: a speed measurement sensor for measuring a speed of the apparatus for conveying the carrier; and a control unit for adjusting the strength of the magnet member based on the speed of the apparatus for conveying the carrier.

The speed measurement sensor may be installed on a surface of the plate.

The apparatus for conveying the carrier may further include: a driving control unit supporting a body including the gripper and the lifter and generating a driving force; a driving wheel installed on a side of the driving control unit and moving on a rail based on the driving force; and a guide wheel installed under the driving control unit and preventing the driving wheel from being deviated from the rail.

In another aspect of an apparatus for conveying a carrier of the present invention, the apparatus for conveying the carrier conveys a carrier containing a wafer, and includes: a gripper for gripping the carrier and including a plate; and a lifter for raising and lowering the gripper and including a magnet member, in which the gripper and the lifter are connected in a non-contact damping structure using the magnet member and the plate, and when the apparatus for conveying the carrier is traveling, a relative movement of the gripper and the lifter is suppressed by using an eddy current formed between the magnet member and the plate.

In an aspect of a system for controlling a carrier, the system includes: a rail installed on a ceiling; a plurality of carrier conveying devices traveling on the rail and conveying a carrier containing a wafer to a destination; and a carrier controller for controlling a movement of the carrier conveying device, in which the carrier conveying device includes: a gripper for gripping the carrier; and a lifter for raising and lowering the gripper, in which the gripper and the lifter are connected in a non-contact damping structure, and a relative motion thereof is suppressed.

Other specific details of embodiments are included in the detailed description and drawings.

BRIEF DESCRIPTION OF THE DRAWINGS

The above and other aspects and features of the present invention will become more apparent by describing in detail exemplary embodiments thereof with reference to the attached drawings, in which:

FIG. 1 is a cross-sectional view showing a schematic structure of an apparatus for conveying a carrier according to an embodiment of the present invention;

FIG. 2 is a cross-sectional view showing an installation form of the apparatus for conveying the carrier according to the embodiment of the present invention;

FIG. 3 is a partially enlarged view showing a coupled form of a gripper and a lifter constituting the apparatus for conveying the carrier according to the embodiment of the present invention;

FIG. 4 is an exemplary view for explaining a non-contact damping structure of the gripper and the lifter constituting the apparatus for conveying the carrier according to the embodiment of the present invention;

FIG. 5 is a partially enlarged view of an apparatus for conveying a carrier according to another embodiment of the present invention; and FIG. 6 is a conceptual view showing a schematic structure of a system for controlling a carrier having an apparatus for conveying a carrier according to an embodiment of the present invention.

DETAILED DESCRIPTION OF THE EMBODIMENTS

Hereinafter, preferred embodiments of the present invention will be described in detail with reference to the accompanying drawings. Benefits and features of the present invention, and methods for achieving them will be clarified with reference to embodiments described below in detail together with the accompanying drawings. However, the present invention is not limited to the embodiments disclosed below, but may be implemented in various different forms. The embodiments are provided only to make the disclosure of the present invention complete, and to fully inform the scope of the invention to those skilled in the art to which the present invention pertains. The invention is only defined by the scope of the claims. Like reference numerals refer to like elements throughout the specification.

When it is referred that elements are "on" or "above" the other elements, it includes a case where other elements are interposed in the middle as well as directly above other elements. On the other hand, when it is referred that elements are "directly on" or "directly above" other elements, it indicates that there are no intervening elements or layers.

The spatially relative terms "below," "beneath," "lower," "above," "upper," or the like may be used to easily describe the correlation between one element and other elements as shown in the drawings. The spatially relative terms should be understood as terms including different directions of an element in use or operation in addition to the directions shown in the drawings. For example, if elements shown in the drawings are turned over, elements described as "below" or "beneath" of other elements may be placed "above" other elements. Accordingly, an exemplary term "below" may include both the directions below and above. Elements may also be oriented in different directions, so that the spatially relative terms may be interpreted depending on the orientation.

Although the first, second, etc. are used to describe various elements, components, and/or sections, it goes without saying that these elements, components, and/or sections are not limited by these terms. These terms are only used to distinguish one element, component, or section from other elements, components, or sections. Accordingly, it goes without saying that a first element, a first component, or a first section mentioned below may be a second element, a second component, or a second section within the technical spirit of the present invention.

The terms used herein are for the purpose of describing embodiments and are not intended to limit the present invention. Herein, the singular also includes the plural unless specifically stated otherwise in the phrase. The terms "comprises" and/or "comprising" as used herein do not exclude the presence or addition of one or more other components, steps, operations, and/or elements mentioned.

Unless otherwise defined, all terms (including technical and scientific terms) used herein may be used in a sense that may be commonly understood by those of ordinary skill in the art. In addition, the terms defined in the commonly used dictionaries are not ideally or excessively interpreted unless they are specifically defined clearly.

Hereinafter, embodiments of the present invention will be described in detail with reference to the accompanying drawings. In the description with reference to the accompanying drawings, the same or corresponding components are assigned the same reference numbers regardless of drawing numbers, and redundant description thereof will be omitted.

Overhead hoist transport (OHT) may use a pin/holder structure to suppress a relative movement of a hoist and a hand. However, when transporting a front opening unified pod (FOUP), there is a problem in that vibration and impact occur due to the collision of the pin and the holder, and thus is transferred to a wafer in the FOUP.

The present invention relates to an apparatus for conveying a carrier and a system for controlling a carrier having the same, in which a non-contact damping structure using a magnet and a non-ferrous metal generates an eddy current to suppress a relative movement of a hoist and a hand. Hereinafter, the present invention will be described in detail with reference to the drawings or the like.

FIG. 1 is a cross-sectional view showing a schematic structure of an apparatus for conveying a carrier according to an embodiment of the present invention. FIG. 2 is a cross-sectional view showing an installation form of the apparatus for conveying the carrier according to the embodiment of the present invention.

Referring to FIGS. 1 and 2, an apparatus 100 for conveying a carrier may include a body 110, a driving control unit 120, a driving wheel 130, and a guide wheel 140.

The apparatus 100 for conveying the carrier conveys a carrier to various facilities, where a semiconductor device manufacturing process is performed, in a clean room. The apparatus 100 for conveying the carrier may be implemented with, for example, the OHT. On the other hand, the carrier stores a plurality of wafers, and, for example, it may be implemented as the FOUP.

The body 110 may raise a carrier 150 to the vicinity of a ceiling of the clean room after gripping the carrier 150 in order to convey the carrier 150 to the facility where the next process is performed. The body 110 may be installed under the driving control unit 120 for this purpose, and may be configured to include a gripper 111 and a lifter 112.

The gripper 111 grips the carrier 150. The gripper 111 may be lowered in a direction in which the carrier 150 is positioned by the lifter 112 to grip the carrier 150 positioned in a downward direction of the apparatus 100 for conveying the carrier. The gripper 111 may be embodied as, for example, a hand gripper.

The lifter 112 lowers the gripper 111 in the direction in which the carrier 150 is positioned so that the gripper 111 may grip the carrier 150. When the carrier 150 is gripped by the gripper 111, the lifter 112 may raise the gripper 111 gripping the carrier 150 toward the ceiling of the clean room.

After the carrier 150 is gripped by the gripper 111, it is raised to the ceiling of the clean room by the lifter 112. In this state, it may be conveyed to the facility where the next process is performed. When the apparatus 100 for conveying the carrier reaches a destination, the lifter 112 may lower the carrier 150 to transfer the carrier 150 to the facility where the next process is performed. The lifter 112 may be implemented, for example, as a hoist.

The gripper 111 and the lifter 112 may be coupled into a non-contact damping structure using a magnet and a non-ferrous metal. In this regard, a more detailed description will be described later with reference to the drawings.

The driving control unit 120 controls the driving wheel 130 moving along a rail 210. The driving control unit 120 may be coupled to a pair of driving wheels 130 through both sides, and may be coupled to the body unit 110 through a lower surface. The driving control unit 120 may also serve to support the body 110 positioned under it.

The driving control unit 120 may include a driving motor (not shown), a driving shaft (not shown), a speed adjusting unit (not shown), or the like.

The driving motor generates a driving force.

The driving shaft transfers the driving force generated by the driving motor to the driving wheel 130.

The speed adjusting unit adjusts a rotational speed of the driving wheel 130.

The driving control unit 120 may provide the driving force to the driving wheel 130 through the driving motor or the driving shaft, and may control the rotational speed of the driving wheel 130 through the speed adjusting unit.

The driving wheel 130 rotates on the rail 210 using the driving force provided from the driving control unit 120. For this, at least one pair of driving wheels 130 may be installed on both sides of the driving control unit 120.

The guide wheel 140 prevents the apparatus 100 for conveying the carrier from being deviated from the rail 210 when traveling on the rail 210. For this, at least one pair of guide wheels 140 may be installed on both sides of the lower surface of the driving control unit 120 in a vertical direction to the driving wheels 130.

The rail 210 provides a path through which the apparatus 100 for conveying the carrier may move. The rail 210 may be installed on a ceiling of a clean room equipped with a manufacturing line for manufacturing semiconductor devices.

The rail 210 and a rail support 210 may be installed on the ceiling of the clean room. Here, the rails 210 may be coupled to both sides of the rail support 220 fixed to the ceiling of the clean room, and may be provided as a pair.

The rail 210 may be formed by mixing various types of sections such as a straight section, a curved section, a slope section, or a branch section depending on a layout in the clean room. However, the present embodiment is not limited thereto. The rail 210 may be formed of only a single section (e.g., a straight section).

The rail support 220 is installed on the ceiling of the clean room to support the rail 210. The rail support part 220 may be formed in a cap shape, for example, in a ∩ shape or a Π shape.

The apparatus 100 for conveying the carrier may further include a cable fixing unit (not shown), a correction unit (not shown), or the like.

The cable fixing unit secures a cable arranged under the rail 210. The cable fixing unit may be implemented, for example, with a litz wire supporter.

The correction unit corrects a position of the carrier 150 when transporting the carrier 150 to a destination. The correction unit may be arranged between the body unit 110 and the driving control unit 120 to correct the position of the carrier 150.

The correction unit may include a slider and a rotator.

The slider moves the carrier 150. The slider may be installed on the lower surface of the driving control unit 120. The slider may move the carrier 150 in an upper direction, a lower direction, a left direction, a right direction, or the like.

The rotator rotates the carrier 150. The rotator may be installed on a lower surface of the slider. The rotator may rotate the carrier 150 clockwise, counterclockwise, or the like.

As described above, in the present embodiment, the gripper 111 and the lifter 112 may be coupled into the non-contact damping structure using the magnet and the non-ferrous metal. This will be described below.

FIG. 3 is a partially enlarged view showing a coupled form of a gripper and a lifter constituting the apparatus for conveying the carrier according to the embodiment of the present invention. The following description refers to FIG. 3.

The gripper 111 may constitute the non-contact damping structure with the lifter 112. To this end, a plate 310 coupled to the lifter 112 may be formed of a metal. The plate 310 may be formed of, for example, a non-ferrous metal such as copper (Cu).

The plate 310 may be formed on an upper surface of a body of the gripper 111. However, the present embodiment is not limited thereto. The plate 310 may be formed over the entire body of the gripper 111.

The lifter 112 may be coupled with the plate 310 of the gripper 111 through a plurality of connecting members. The lifter 112 may be coupled with the plate 310 of the gripper 111 through, for example, a first connecting member 321 and a second connecting member 322. The lifter 112 may raise and lower the gripper 111 using the first connecting member 321 and the second connecting member 322.

A first magnet member 331 and a second magnet member 332 may be installed at ends of the first connection member 321 and the second connection member 322, respectively. Specifically, the first magnet member 331 and the second magnet member 332 may be installed on a portion of the gripper 111 that is coupled with the plate 310 in order for the gripper 111 and the lifter 112 to form the non-contact damping structure.

In the present embodiment, a plurality of magnet members 331 and 332 may be installed corresponding to the number of connecting members 321 and 322. The magnet members 331 and 332 may be implemented with, for example, electromagnets.

The gripper 111 and the lifter 112 may generate an eddy current through interaction between the plate 310 and the magnet members 331 and 332. This will be described below.

FIG. 4 is an exemplary view for explaining a non-contact damping structure of the gripper and the lifter constituting the apparatus for conveying the carrier according to the embodiment of the present invention. The following description refers to FIG. 4.

When the apparatus 100 for conveying the carrier travels on the rail 210 to convey the carrier 150 to the destination, an electromotive force may be generated while a magnetic flux of the first magnet member 331 and the second magnet member 332 are changed.

Here, a swirl current, i.e., an eddy current 410 may be formed on the plate 310 by this electromotive force. In addition, a secondary electric field, i.e., a second electric field 420 may be generated according to a flow of the eddy current 410.

The second electric field 420 may generate a damping force 430 relative to a moving direction of the apparatus 100 for conveying the carrier by doing an attractive force and a repulsive force action with the previously generated electric field (i.e., a first electric field).

In the present embodiment, the relative movement of the gripper 111 and the lifter 112 may be suppressed when the apparatus 100 for conveying the carrier is moved through the damping force 430. In addition, since the pin/holder structure is not used unlike the conventional method, the effect of vibration and impact on the wafer may be minimized. Also, the non-contact structure characteristics of the gripper 111 and the lifter 112 may minimize the generation of particles and have a shock absorbing characteristic.

In the present embodiment, it is also possible to actively control the degree of damping by using a speed measurement sensor. This will be described below.

FIG. 5 is a partially enlarged view of an apparatus for conveying a carrier according to another embodiment of the present invention. The following description refers to FIG. 5.

The speed measurement sensor 510 measures a moving speed of the apparatus for conveying the carrier 100. The speed measurement sensor 510 may be installed in the gripper 110. The speed measurement sensor 510 may be installed on a surface of the plate 310, for example.

The control unit 520 adjusts a strength of the magnet members 331 and 332 based on the measured value of the speed measurement sensor 510. By this, the control unit 520 may actively control the damping between the gripper 111 and the lifter 112. In the present embodiment, the control unit 520 may be implemented as a computer equipped with a processor having an arithmetic function.

Next, a system for controlling a carrier provided with the apparatus 100 for conveying the carrier is described.

FIG. 6 is a conceptual view showing a schematic structure of a system for controlling a carrier having an apparatus for conveying a carrier according to an embodiment of the present invention.

Referring to FIG. 6, the system 600 for controlling the carrier may include the apparatus 100 for conveying the carrier, a carrier controller 610, and a database 620.

A plurality of apparatuses 100 for conveying the carrier may be provided and arranged on the rail 210. Here, each of the apparatus 100 for conveying the carrier may convey the carrier 150 to the destination based on information received from the carrier controller 610.

The apparatus 100 for conveying the carrier may wirelessly communicate with the carrier controller 610 to receive information from the carrier controller 610. However, the present embodiment is not limited thereto. The apparatus for conveying the carrier 100 may be connected to the carrier controller 610 by wire and receive information from the carrier controller 610 through a wired signal.

The carrier controller 610 controls the apparatus for conveying the carrier 100. The carrier controller 610 may be implemented as a computer equipped with a processor having an arithmetic function.

The database 620 is connected to the carrier controller 610 by wire or wireless, and provides information necessary for the carrier controller 610 to control the plurality of apparatuses 100 for conveying the carrier.

The database 620 may be implemented in the form of a memory inside the carrier controller 610. However, the present embodiment is not limited thereto. The database 620 may also be provided in the system 600 for controlling the carrier separately from the carrier controller 610.

The apparatus 100 for conveying the carrier has been described above with reference to FIGS. 1 to 6. The apparatus 100 for conveying the carrier according to the present embodiment may be applied to a logistics automation service, and the following benefits may be obtained.

First, by removing the cause of the existing vibration, it is possible to minimize the impact of vibration of the transported object when the apparatus for conveying the carrier 100 is traveling.

Second, by using the eddy current effect, it is possible to prevent the departure, which is a concern when removing the pin/holder.

Third, the impact of the left and right movements may be minimized by the damping force generated by the eddy current.

Fourth, it becomes possible to increase a branch running speed.

Fifth, the amount of particles generated may be lowered than before by the non-contact structure.

Sixth, by actively controlling the amount of damping and drag, it is possible to realize departure prevention and shock absorption of the apparatus for conveying the carrier 100.

The embodiments of the present invention have been described with reference to the accompanying drawings. However, it may be understood that those of ordinary skill in the art to which the present invention pertains may implement the present invention in other specific forms without changing its technical spirit or essential features. Therefore, it should be understood that the embodiments described above are exemplary in all respects and not restrictive.

REFERENCE NUMERAL

| | |
|---|---|
| 100: apparatus for conveying carrier | 110: body |
| 111: gripper | 112: lifter |
| 120: driving control unit | 130: driving wheel |
| 140: guide wheel | 150: carrier |
| 210: rail | 220: rail support |
| 310: plate | 321, 322: connecting member |
| 331, 332: magnet member | 510: speed measurement sensor |
| 520: control unit | 600: system for controlling carrier |
| 610: carrier controller | 620: database |

What is claimed is:

1. An apparatus for conveying a carrier, the apparatus conveying the carrier containing a wafer, and comprising:
    a gripper for gripping the carrier; and
    a lifter for raising and lowering the gripper,
    wherein the gripper and the lifter are connected in a non-contact damping structure using a magnet member and a plate, and damping between the gripper and the lifter is controlled,
    wherein the lifter is connected to the gripper using a plurality of connecting members,
    wherein the magnet member is installed at an end of the connecting member, and
    wherein the plate is installed on the gripper adjacent to the magnet member.

2. The apparatus of claim 1, further comprising:
    a driving control unit supporting a body including the gripper and the lifter and generating a driving force;

a driving wheel installed on a side of the driving control unit and moving on a rail based on the driving force; and a guide wheel installed under the driving control unit and preventing the driving wheel from being deviated from the rail.

3. The apparatus of claim 1, wherein the relative motion of the gripper and the lifter is suppressed using a current formed between the magnet member and the plate.

4. The apparatus of claim 3, wherein the current is an eddy current.

5. The apparatus of claim 1, wherein the magnet member is an electromagnet.

6. The apparatus of claim 1, wherein the plate is formed of a non-ferrous metal.

7. The apparatus of claim 1, further comprising:
a speed measurement sensor for measuring a speed of the apparatus for conveying the carrier; and
a control unit for adjusting a strength of the magnet member based on the speed of the apparatus for conveying the carrier.

8. The apparatus of claim 7, wherein the speed measurement sensor is installed on a surface of the plate.

9. The apparatus of claim 1, wherein damping between the gripper and the lifter is controlled depending on a strength of the magnet member.

10. The apparatus of claim 1, wherein the relative movement of the gripper and the lifter is suppressed when the apparatus for conveying the carrier is traveling.

11. An apparatus for conveying the carrier, the apparatus conveying the carrier containing a wafer, and comprising:
a gripper for gripping the carrier and including a plate; and
a lifter for raising and lowering the gripper and including a magnet member,
wherein the gripper and the lifter are connected in a non-contact damping structure using the magnet member and the plate,
wherein when the apparatus for conveying the carrier is traveling, a damping between the gripper and the lifter is controlled by using an eddy current formed between the magnet member and the plate,
wherein the lifter is connected to the gripper using a plurality of connecting members,
wherein the magnet member is installed at an end of the connecting member, and
wherein the plate is installed on the gripper adjacent to the magnet member.

12. A system for controlling a carrier, comprising:
a rail installed on a ceiling;
a plurality of carrier conveying devices traveling on the rail and conveying a carrier containing a wafer to a destination; and
a carrier controller for controlling a movement of the carrier conveying device,
wherein the carrier conveying device comprises:
a gripper for gripping the carrier; and
a lifter for raising and lowering the gripper,
wherein the gripper and the lifter are connected in a non-contact damping structure using a magnet member and a plate, and a damping between the gripper and the lifter is controlled,
wherein the lifter is connected to the gripper using a plurality of connecting members,
wherein the magnet member is installed at an end of the connecting member, and
wherein the plate is installed on the gripper adjacent to the magnet member.

13. The system of claim 12, wherein the relative movement of the gripper and the lifter is suppressed when the carrier conveying device is traveling.

14. The system of claim 12, wherein damping between the gripper and the lifter is controlled depending on a strength of the magnet member.

15. The system of claim 12, wherein the carrier conveying device further comprises:
a speed measurement sensor for measuring a speed of the carrier conveying device; and
a control unit for adjusting a strength of the magnet member based on the speed of the carrier conveying device.

16. The system of claim 12, wherein the relative motion of the gripper and the lifter is suppressed using a current formed between the magnet member and the plate.

* * * * *